US006040611A

United States Patent [19]

De Los Santos et al.

[11] Patent Number: 6,040,611

[45] Date of Patent: Mar. 21, 2000

[54] MICROELECTROMECHANICAL DEVICE

[75] Inventors: Hector J. De Los Santos, Inglewood; Yu-Hua Kao, Los Angeles; Arturo L. Caigoy, Chino Hills; Eric D. Ditmars, Redondo Beach, all of Calif.

[73] Assignee: Hughes Electonics Corporation, Los Angeles, Calif.

[21] Appl. No.: 09/150,901

[22] Filed: Sep. 10, 1998

[51] Int. Cl.[7] .......................... H01L 27/14; H01L 29/82; H01L 29/84

[52] U.S. Cl. .......................... 257/415; 257/414; 438/50; 438/52

[58] Field of Search .......................... 257/414, 415, 257/417, 418; 438/50, 52

[56] References Cited

U.S. PATENT DOCUMENTS

| | | | |
|---|---|---|---|
| 5,619,061 | 4/1997 | Goldsmith et al. | 257/528 |
| 5,659,195 | 8/1997 | Kaiser et al. | 257/415 |
| 5,665,997 | 9/1997 | Weaver et al. | 257/414 |
| 5,673,139 | 9/1997 | Johnson | 359/291 |
| 5,818,093 | 10/1998 | Gutteridge et al. | 257/417 |

*Primary Examiner*—Mahshid Saadat
*Assistant Examiner*—Allan R. Wilson
*Attorney, Agent, or Firm*—Terje Gudmestad; Georgann S. Grunebach; Michael W. Sales

[57] ABSTRACT

A microelectromechanical (MEM) device includes a substrate and a flexible cantilever beam. The substrate has positioned thereon a first interconnection line separated by a first gap and a second interconnection line separated by a second gap parallel to the first interconnection line. The substrate also has positioned thereon a first and second primary control electrode wherein one of the first and second primary control electrodes is positioned on one side of one of the first and second interconnection lines and the other one is positioned on the other side of the other first and second interconnection lines. The flexible cantilever beam has a top surface and a bottom surface and a beam width slightly larger than the gap widths at the gaps. A flexible anchor is secured to the bottom surface of the beam at a center of the beam and attached to a center of the substrate so as to position the beam orthogonally to the first and second interconnection lines. Secondary control electrodes are secured to the bottom surface of the beam and positioned opposite the primary control electrodes. First and second contact pads are secured to the bottom surface of the beam and positioned opposite the first and second interconnection lines.

15 Claims, 15 Drawing Sheets

MICROELECTROMECHANICAL DEVICE

TECHNICAL FIELD

This invention relates to microelectromechanical devices.

BACKGROUND ART

Known prior art microelectromechanical (MEM) devices are based on a cantilever beam, as shown in FIG. 1. The beam 10 acts as one plate of a parallel-plate capacitor. A voltage, the actuation voltage, applied between the beam 10 and an electrode 12 on the substrate 14 exerts a force of attraction on the beam 10 which, if the force is large enough, overcomes the stiffness of the beam 10 and causes the beam 10 to bend to contact a secondary electrode 16, thus completing a continuous path. While the prior art MEM device appears to be a simple device, actual implementation meets with a number of drawbacks.

For instance, there tends to be sticking between the beam tip 18 and the secondary electrode 16 so that once closed as a result of the application of the actuation voltage, its removal may not result in the opening of the device. This may occur when the stiction forces overcome the spring restoring forces. In this device, the device opening phase is not electrically, but mechanically controlled, i.e., it is up to "mother nature," embodied in the restoring forces of the beam 10 to effect the opening.

There is also a disadvantageous trade-off between actuation voltage and off isolation. That is, to obtain a low actuation voltage the beam-to-substrate separation should be small, but in turn, a small beam-to-substrate separation results in a large off-parasitic capacitance, thus a low off RF isolation.

Furthermore, the maximum frequency at which the beam can deflect and relax, i.e., turn on/off, is related to its geometry and material properties, in particular, its length, thickness, bulk modulus, and density. Therefore, it may be impossible in some applications to achieve high switching frequencies at practical beam geometries and/or voltages.

One of the intrinsic problems of the cantilever beam device is that the beam's change of state, from open to close, is the result of an instability. Essentially, the beam deforms gradually and predictably, as a function of the applied actuation voltage, up to a threshold. Beyond this threshold, an instability, whereby control is lost, occurs and the beam comes crashing down on the bottom electrode. A number of undesirable conditions result, such as stiction, i.e., the switch remains closed even after removal of the actuation voltage, as well as contact deterioration, which will impair the useful life of the device.

DISCLOSURE OF THE INVENTION

It is thus a general object of the present invention to provide a microelectromechanical (MEM) device requiring only a low actuation voltage to effect switching.

It is another object of the present invention to provide a MEM device that exhibits a high off isolation.

It is yet another object of the present invention to provide a MEM device in which the switching action is independent from the stiffness of the beam.

Still further, it is an object of the present invention to provide a MEM device in which stiction is substantially reduced.

In carrying out the above objects and other objects, features, and advantages of the present invention, a MEM device is provided for realizing a low actuation voltage, low-insertion loss, high-isolation and high-switching frequency device not limited by stiction. The MEM device includes a substrate having positioned thereon a first interconnection line separated by a first gap having a first gap width and a second interconnection line separated by a second gap having a second gap width and parallel to the first interconnection line. The substrate includes a first and second primary control electrode wherein one of the first and second primary control electrodes is positioned on one side of one of the first and second interconnection lines and wherein the other one of the first and second primary control electrodes is positioned on the other side of the other one of the first and second interconnection lines. The MEM device further includes a flexible cantilever beam having a top surface and a bottom surface and a beam width slightly larger than the first and second gap widths at a first and second portion corresponding to the first and second interconnection lines. A flexible anchor is secured to the bottom surface of the beam at a center of the beam and attached to a center of the substrate so as to position the beam orthogonally to the first and second interconnection lines. First and second secondary control electrodes are secured to the bottom surface of the beam and positioned opposite the first and second primary control electrodes. First and second contact pads are secured to the bottom surface of the beam and positioned opposite the first and second interconnection lines, wherein when a voltage is applied to one of the first and second primary control electrodes and the corresponding one of the first and second secondary control electrodes the beam will move towards the one of the first and second primary control electrodes causing one of the first and second contact: pads to overlap the corresponding one of the first and second gaps so as to make an electrical connection between the corresponding one of the first and second interconnection lines.

The above objects and other objects, features and advantages of the present invention are readily apparent from the following detailed description of the best mode for carrying out the invention when taken in connection with the accompanying drawings.

BEST MODES FOR CARRYING OUT THE INVENTION

Figure 1:
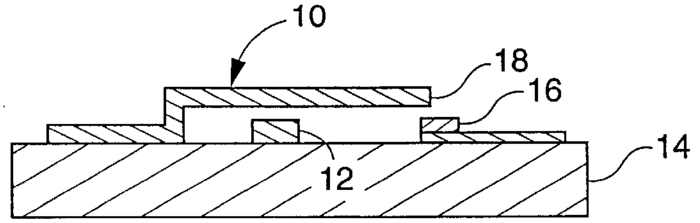
Fig. 1 (PRIOR ART)
FIG. 1 is a side view of a known prior art microelectromechanical (MEM) device.
Figure 2:
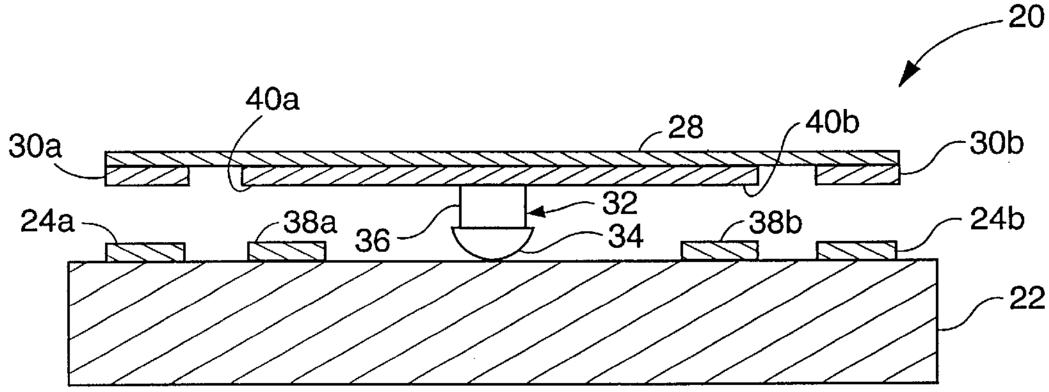
FIG. 2 is a side view of a MEM device made in accordance with the teachings of the present invention.
Figure 3:
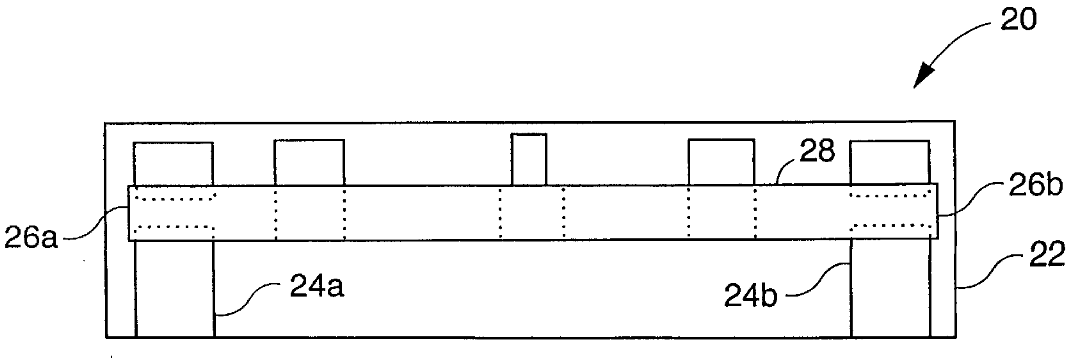
FIG. 3 is a top view of the MEM device shown in FIG. 2.

Turning now to FIGS. 2 and 3, there is shown a side view and a top view of tile MEM device of the present invention, respectively, denoted generally by reference numeral 20. The MEM device 20 includes a substrate 22. Positioned on the substrate 22 are first and second interconnection lines 24*a*, 24*b*, positioned parallel to each other. Interconnection lines 24*a*, 24*b* are each separated by a gap 26*a*, 26*b*, respectively. Interconnection lines 24*a*, 24*b* are continuous when the gaps 26*a*, 26*b*, respectively, are bridged.

Positioned above the substrate 22 to bridge the interconnection lines 24*a*, 24*b* is a flexible cantilever beam 28 positioned orthogonally to the interconnection lines 24*a*, 24*b* and having a width at least as large as the widths of the gaps 26*a*, 26*b* at the gaps 26*a*, 26*b*. On the bottom surface of beam 28 are positioned a first and second contact pad 30*a*, 30*b*, for bridging the interconnection lines 24*a*, 24*b*, respectively.

This is accomplished by pivoting the beam 28 at its center via a flexible anchor 32. The flexible anchor 32 may be made of a metal material, a ceramic-like dielectric material, or a polyamide material. Furthermore, flexible anchor 32 may be a composite anchor in which a base 34 of the anchor 32 is made of a material with a large Young's modulus, while a post 36 of the anchor 32 is made of a material with a small Young's modulus, or vice versa, thus enabling extremely low actuation voltages.

In order to move contact pads 30*a*, 30*b* towards interconnection lines 24*a*, 24*b*, respectively, primary control electrodes 38*a*, 38*b* are positioned on top of the substrate 22, while corresponding opposite secondary control electrodes 40*a*, 40*b* are positioned on the bottom surface of the beam 28. Secondary control electrodes 40*a*, 40*b* may be one continuous electrode, as shown in FIG. 2, rather than two separate electrodes. Primary control electrodes 38*a*, 38*b* may be positive electrodes while secondary control electrodes 40*a*, 40*b* may be negative electrodes, or vice versa.

Figure 4:
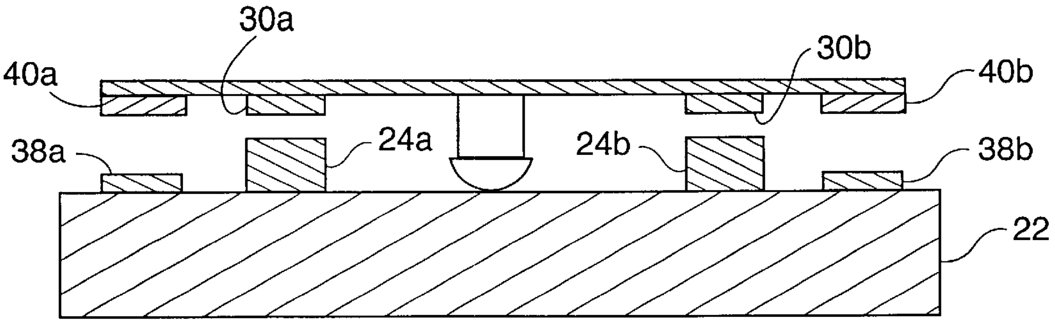
FIG. 4 is a side view of an alternative MEM device made in accordance with the teachings of the present invention.

Primary control electrodes 38*a*, 38*b* could also be positioned outside of interconnection lines 24*a*, 24*b*, as shown in FIG. 4. In this case, secondary control electrodes 40*a*, 40*b* are also positioned outside contact pads 30*a*, 30*b*, and the interconnection lines 24*a*, 24*b* require a height larger than that of the primary control electrodes 38*a*, 38*b*.

Thus, when an appropriate voltage level is applied to primary control electrode 38*a* and secondary control electrode 40*a*, while a lower voltage or no voltage is applied to primary control electrode 38*b* and secondary control electrode 40*b*, the beam 28 will bridge the gap 26*a* in interconnection line 24*a*, while opening the gap 26*b* in interconnection line 24*b*, and vice versa.

By proper pivot design and properly phasing the magnitudes of the primary control electrodes 38*a*, 38*b*, the rate of switching action can be controlled. Also, the speed of contact between the interconnection lines 24*a*, 24*b*, and the contact pads 30*a* and 30*b*, can be controlled, thus extending contact life. Further, when interconnection line 24*a* is closed, the beam-to-substrate separation on interconnection line 24*b* is greater than can be achieved in prior art cantilever beam devices, thus resulting in higher off-state isolation properties.

Since the position of the beam is controlled by applying actuation voltages on either side of the anchor 32, the switching frequency is controlled by those voltages. Hence, the switching frequency, being independent from the stiffness of the cantilever beam, can be increased significantly. Such a feature will have a tremendous impact on the capability of satellite communications systems, in particular, those embodying architectures that include switching matrices and phased array antennas since low-insertion loss, high-isolation, and high-switching frequency are achieved.

Turning now to FIGS. 5–37, there are shown five examples of processing steps that could be utilized to fabricate typical embodiments of the MEM device 20 possessing the claims stated in the present invention. The elevational views of the five alternative MEM devices are shown in FIGS. 14, 17, 21, 30, and 37. The materials, thicknesses, and processing steps are merely suggested values and techniques to arrive at these five embodiments.

Figure 5:
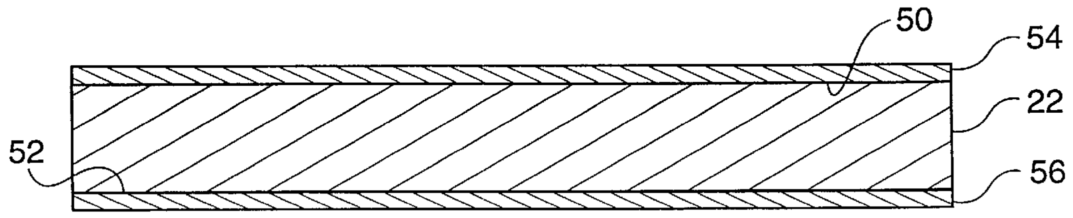
FIG. 5 is an elevational view of the device of the present invention after the step of depositing the TiW-Au layers on the substrate according to a first alternative process.

In a first process, illustrated in FIGS. 5 to 14, a thin layer 54 of TiW-Au is deposited on the circuit side 50 of the substrate 22 of the MEM device 20, as shown in FIG. 5. TiW is a typical adhesion layer between substrates such as $Al_2O_3$ and Au (i.e., gold). The TiW-Au layer can be approximately 250 Å—1 $\mu\mu$m, and the substrate 22 can be 5, 10, 15 or 25 mil polished $Al_2O_3$. This step can be performed in one of various ways, such as, for example, sputtering a:nd/or electroplating. Next, utilizing the techniques described above, a second layer 56 of TiW-Au is deposited on the ground side 52 of the substrate 22 at a thickness determined by the frequency of the application, e.g. typically a few hundred microinches of Au.

Figure 6:
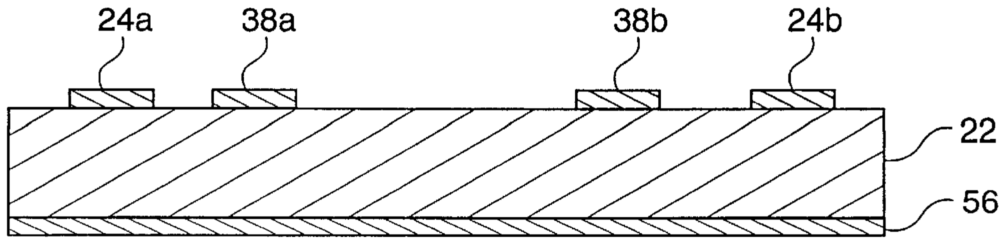
FIG. 6 is an elevational view of the device shown in FIG. 5 after the step of etching the contact pads and transmission lines onto the substrate.
Figure 7:
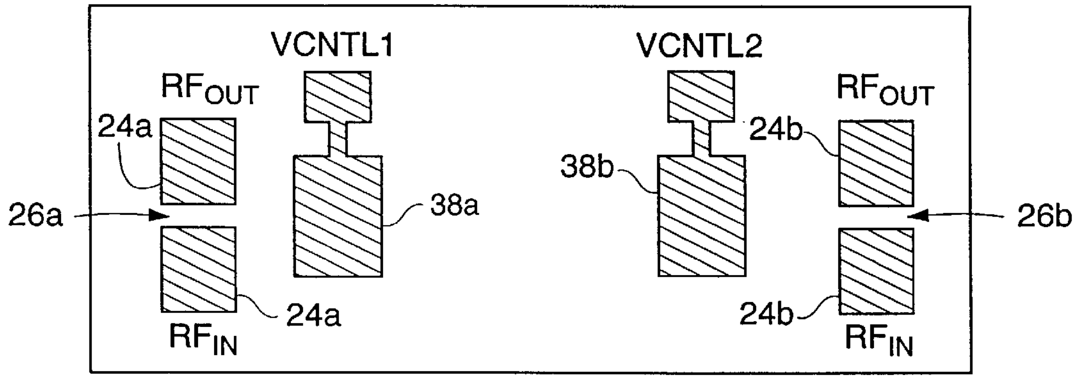
FIG. 7 is a top view of the device shown in FIG. 6.

A positive photoresist is spinned onto the substrate 22 followed by aligning a mask and exposing the photoresist to ultraviolet light to develop a photo-resist pattern. The TiW-Au layer 54 is etched to form the contact pads 38 and the interconnection lines 24, as shown in FIGS. 6 and 7. When the interconnection lines 24 are placed in between the contact pads 38, as shown in FIG. 4, the interconnection lines 24 need to be made thicker than the contact pads 38. The positive photoresist is finally removed with acetone.

Figure 8:
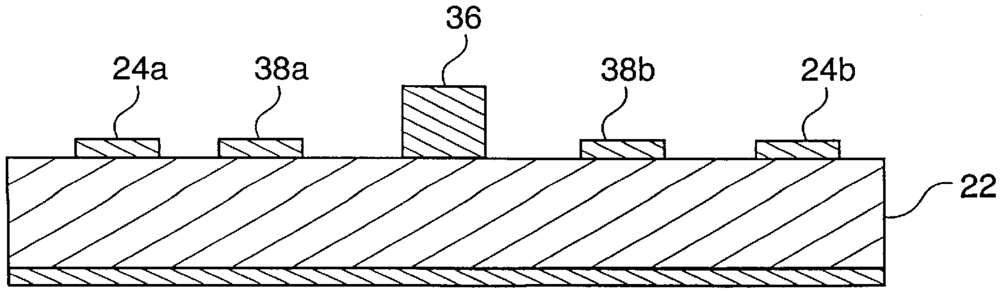
FIG. 8 is an elevational view of the device shown in FIG. 6 after the step of developing the hinge.

The flexible anchor 32 can be made of the various materials previously mentioned. However, for simplicity, a thick layer of polyamide can be spinned onto the substrate 22, as shown in FIG. 8, to form the post 36. The post height depends on the desired actuation voltage, and is usually on the order of microns. A mask is then aligned and exposed to ultraviolet light to develop the post 36.

Figure 9:
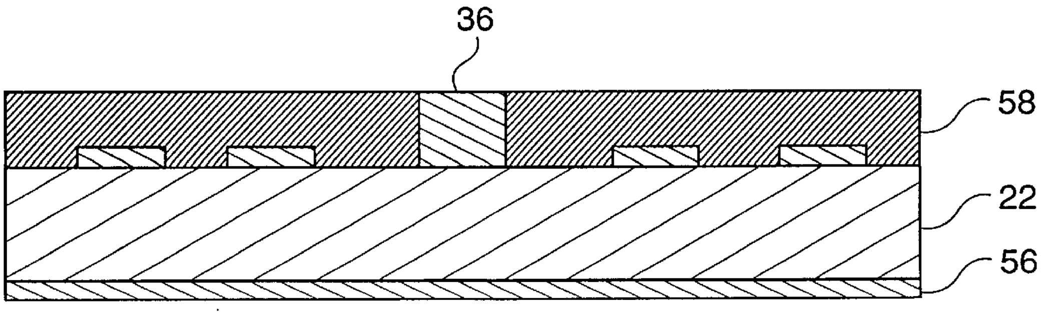
FIG. 9 is an elevational view of the device shown in FIG. 8 after the step of spinning a thick layer of positive photoresist onto the substrate and developing an opening at the top of the hinge and in the adjacent area.
Figure 10:
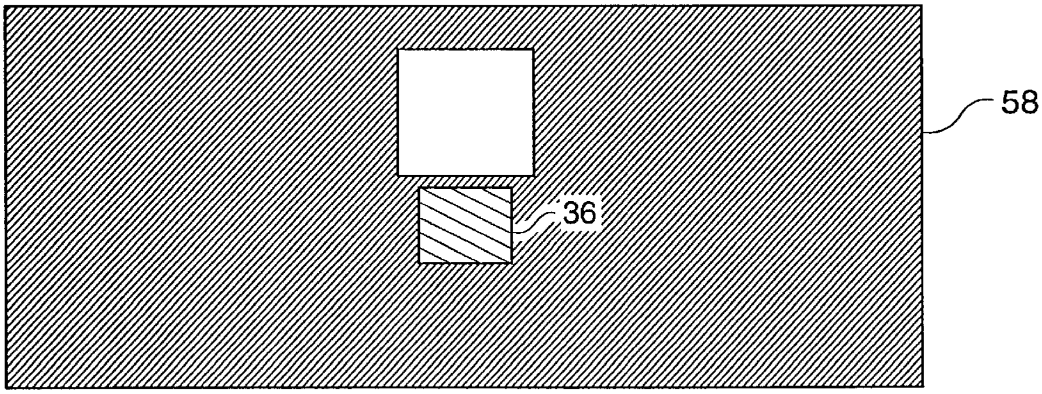
FIG. 10 is a top view of the device shown in FIG. 9.
Figure 11:
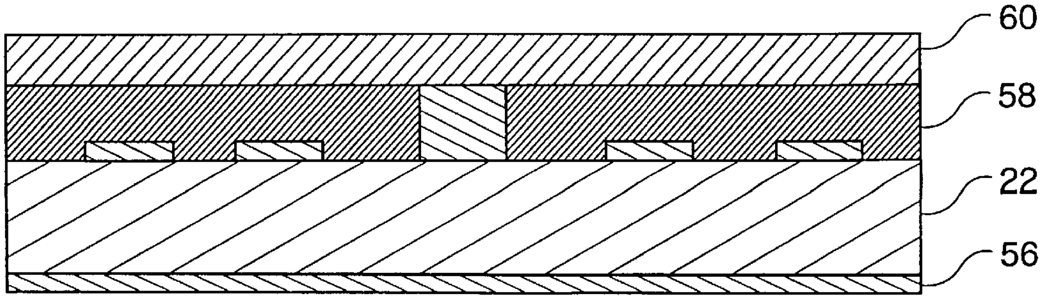
FIG. 11 is an elevational view of the device shown in FIG. 9 after the step of depositing a second layer of TiW-Au onto the device.

A thick layer 58 of a positive photoresist is spinned onto the substrate 22, as shown in FIG. 9. A mask is aligned and exposed to ultraviolet light to develop an opening on top of the post 36 and an adjacent area for defining the ground pad, as shown in FIG. 10. A second layer 60 of TiW-Au is deposited next, as shown in FIG. 11. This layer 60 is the beam material, and is deposited utilizing sputtering or electroplating, or any other similar techniques, to a desired thickness.

Figure 12:
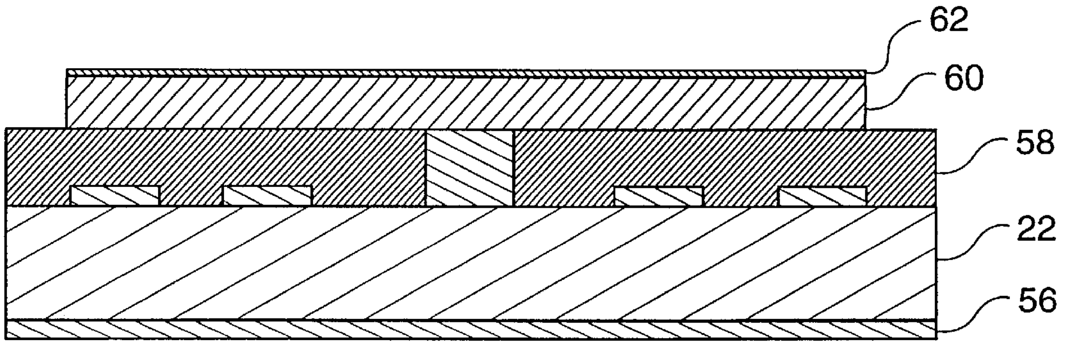
FIG. 12 is an elevational view of the device shown in FIG. 11 after the sleep of spinning and developing a positive photoresist pattern, and etching the TiW-Au layer to form the beam and ground pad.
Figure 13:
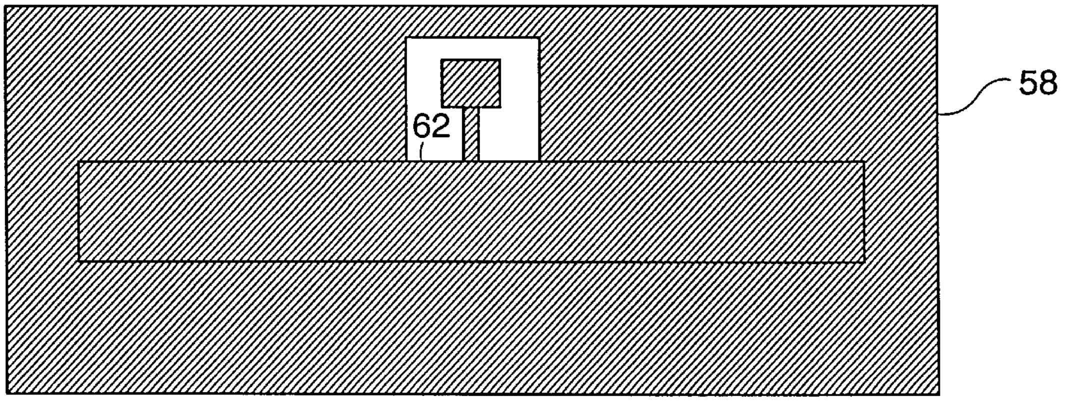
FIG. 13 is a top view of the device shown in FIG. 12.
Figure 14:
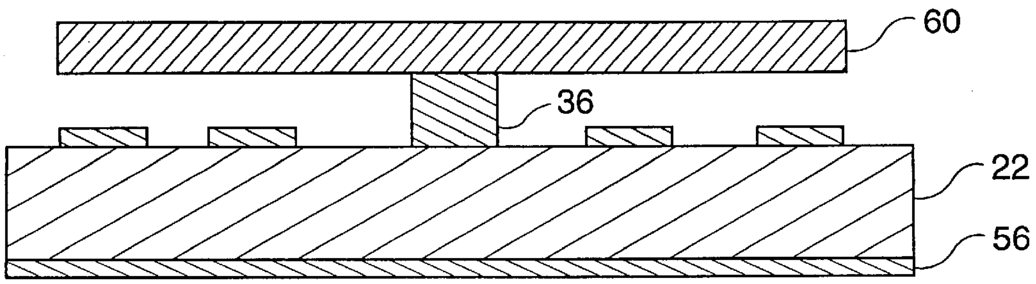
FIG. 14 is an elevational view of the device shown in FIG. 12 after the step of dissolving the positive photoresist layers.
Figure 15:
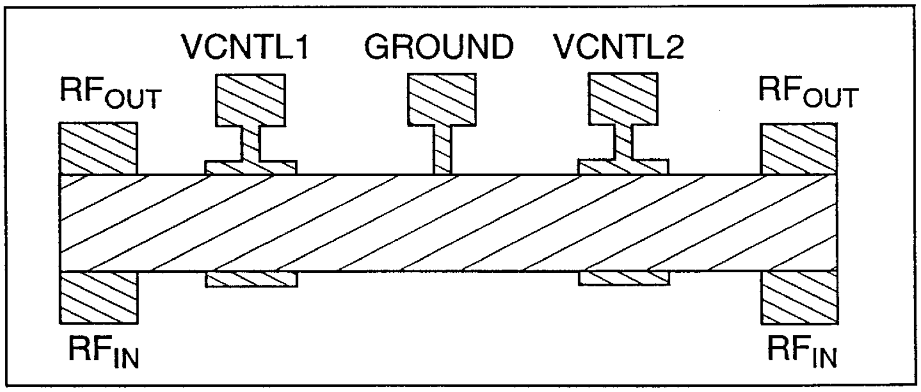
FIG. 15 is a top view of the device shown in FIG. 14.

As shown in FIG. 12, a thin layer 62 of positive photoresist is then spinned onto the device. A mask is aligned and exposed to ultraviolet light to develop the photoresist pattern. The TiW-Au layer 60 is etched to form the beam and adjacent ground pad, as shown in FIGS. 12 and 13. Finally, the beam is released by dissolving the positive photoresist layer 58 with acetone, as shown in FIGS. 14 and 15.

Figure 16:
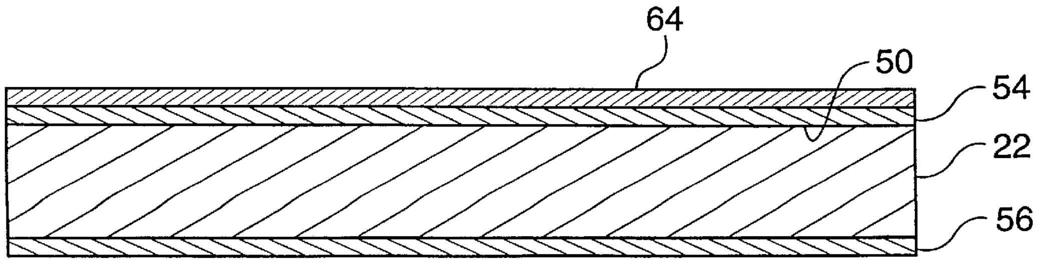
FIG. 16 is an elevational view of the device after the step of depositing a dielectric layer onto the substrate according to a second alternative process.
Figure 17:
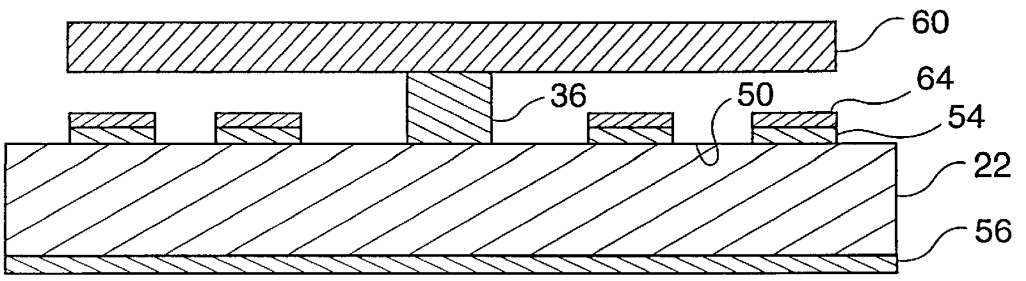
FIG. 17 is an elevational view of the device after the step of dissolving the positive photoresist layers.
Figure 18:
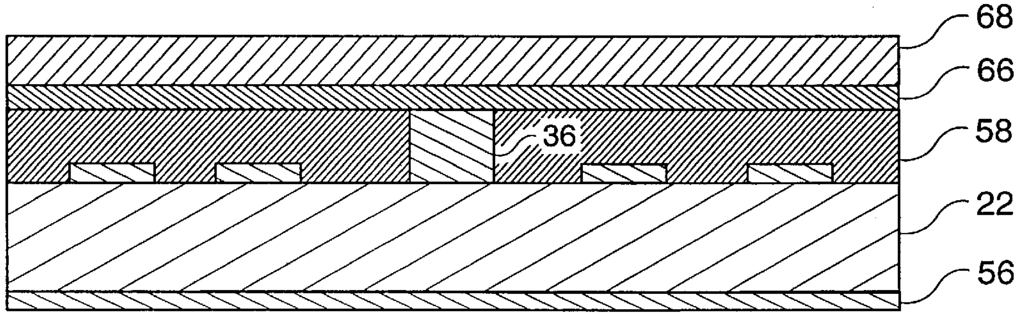
FIG. 18 is an elevational view of the device after the step of depositing TiW-Au and TiW-$Si_3N_4$ layers onto the substrate according to a third alternative process.

In a second alternative process, shown in FIGS. 16–17, a dielectric layer is incorporated to reduce the possibility of beam sticking upon application of voltage. In this embodiment, a thin dielectric layer 64 can be deposited onto the TiW-Au layer 54 on the circuit side 50 of the substrate 22, as shown in FIG. 16. Preferably, the dielectric layer 64 is as thin as possible, less than about 0.5 $\mu$m, and can be, for example, $SiO_2$. The rest of the steps are the same as the first process. The final structure for the second alternative process is shown in FIG. 17, in an elevational view, and is the same as FIG. 14 in a top view.

Figure 19:
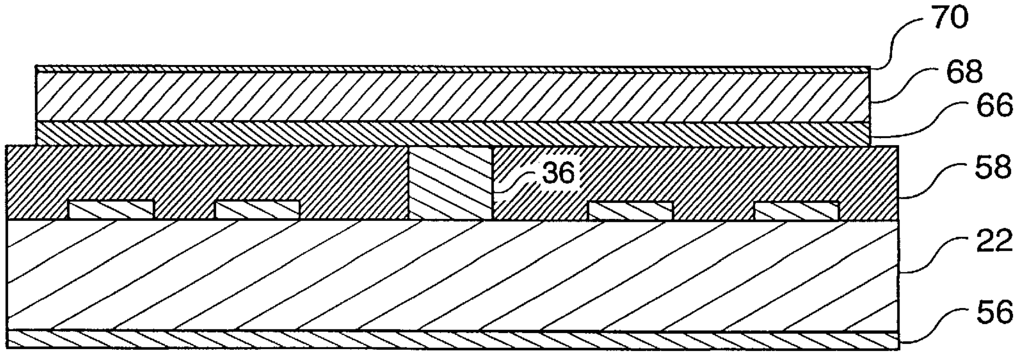
FIG. 19 is an elevational view of the device shown in FIG. 18 after the step of spinning and developing a positive photoresist pattern, and etching the TiW-Au and TiW-$Si_3N_4$ layers t:o form the beam and ground pad.

Turning now to FIGS. 18–22, there is shown the device of the present invention made in accordance with a third alternative process. In this process, the beam material is a thick dielectric with a thin, conductive, or Au underlayer to provide a means for voltage application. That is, rather than depositing only a TiW-Au layer 60 onto the substrate 22 as shown in FIG. 11, two layers are deposited; a TiW-Au layer 66 and a thick TiW-$Si_3N_4$ layer 68, which can be approximately 250 Å—1 $\mu$m and 250 Å—a few $\mu$m, respectively. A positive photoresist pattern 70 is then developed on top of the substrate, and both the TiW-$Si_3N_4$ 68 and TiW-Au 66 layers are etched to form the beam and the ground pad, as shown in FIG. 19.

Figure 20:
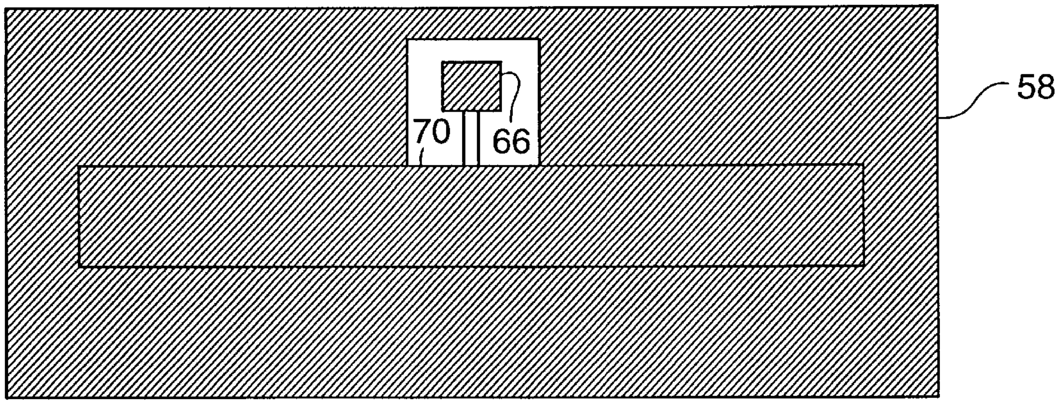
FIG. 20 is a top view of the device shown in FIG. 18 after the step of etching the TiW-$Si_3N_4$ layer to expose the Au ground pad.
Figure 21:
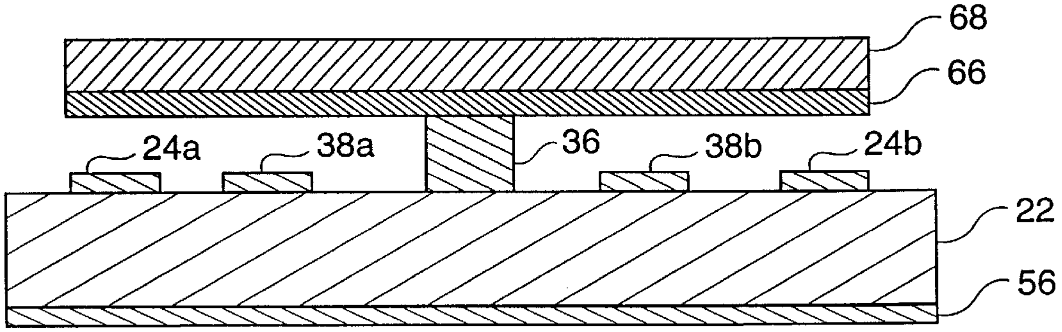
FIG. 21 is an elevational view of the device shown in FIG. 19 after the step of dissolving away the photoresist with acetone.
Figure 22:
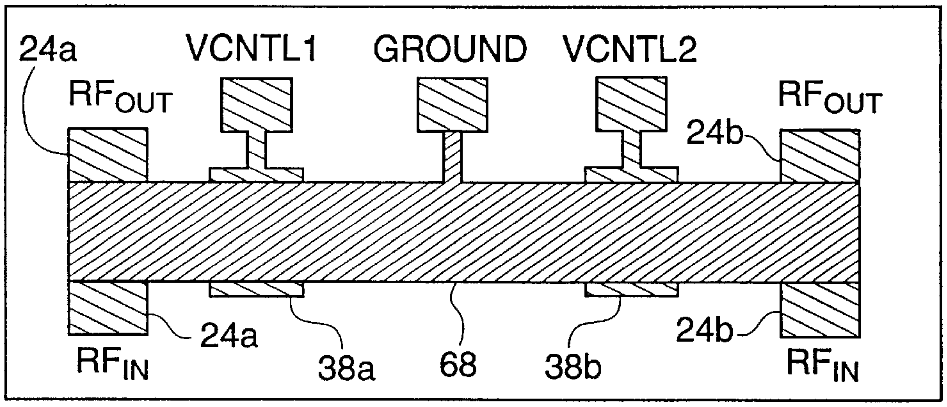
FIG. 22 is a top view of the device shown in FIG. 21.

A second photoresist pattern is developed to allow only the TiW-$Si_3N_4$ layer 68 on top of the Au ground pad to be etched away, as shown in FIG. 20. The last step, releasing the beam by dissolving the photoresist with acetone, is the same as with the previous processes. The final structure for the third alternative process is shown in FIGS. 21 arid 22. Additionally, the Au underlayer 66 can be separated easily into first and second contact pads 30*a* and 30*b*, and secondary control electrodes 40*a* and 40*b*. This is accomplished with an additional step of etching the TiW-Au underlayer immediately after its deposition, but prior to the TiW-$Si_3N_4$ deposition, as exemplified in the fifth alternative process.

Figure 23:
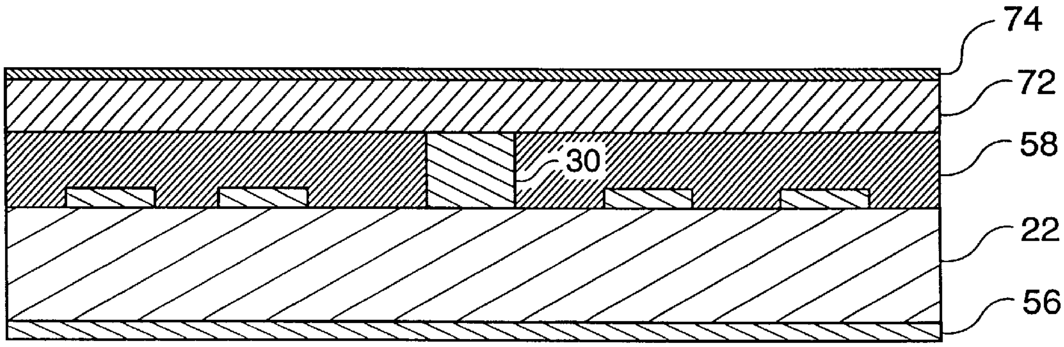
FIG. 23 is an elevational view of the device after the step of depositing a TiW-$Si_3N_4$ layer and a separate TiW layer in accordance with a fourth alternative process.
Figure 24:
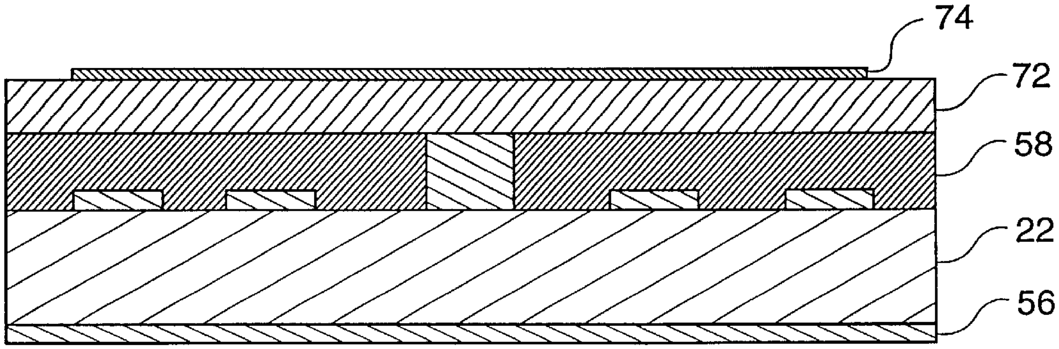
FIG. 24 is an elevational view of the device shown in FIG. 23 after the step of etching the TiW mask pattern with holes.
Figure 25:
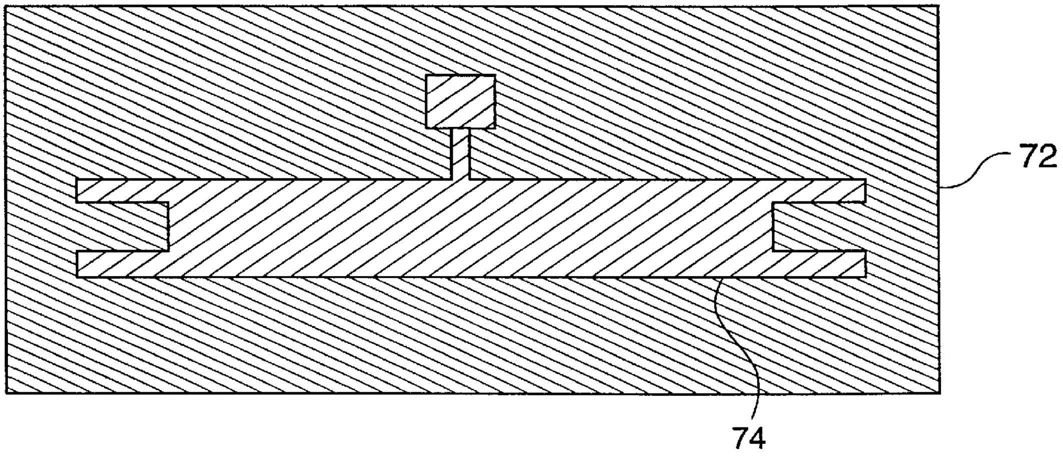
FIG. 25 is a top view of the device shown in FIG. 24.

Turning now to FIGS. 23–30, there are shown elevational and top views of the device of the present invention made in accordance with a fourth alternative process. In this process, the beam material is also a thick dielectric, however, with a thin Au top layer 74 to provide a means for voltage application. The initial steps are the same as first process up to the point where the thick layer 58 of photoresist is spinned onto the substrate 22 and openings are developed on top of the post 36 and in the adjacent area. Next, two separate layers are deposited, a TiW-$Si_3N_4$ layer 72 and an acetone-resistant layer such as TiW 74, as shown in FIG. 23. The TiW-$Si_3N_4$ layer 72 can be 250 Å—a few $\mu$m while the TiW layer 74 can be approximately less than 1 $\mu$m. Using positive photoresist, a beam pattern with holes is etched into the top TiW layer 74, as shown in FIGS. 24 and 25. The top photoresist layer is removed with acetone.

Figure 26:
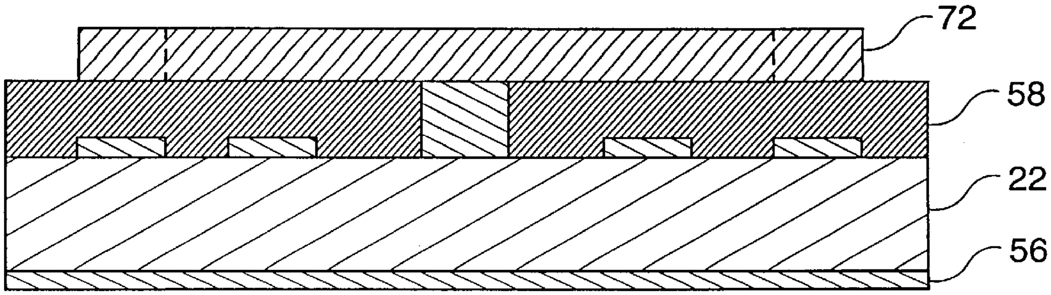
FIG. 26 is an elevational view of the device shown in FIG. 24 after the step of etching the TiW-$Si_3N_4$ layer to form the beam and the ground pad, and removing the TiW mask.
Figure 27:
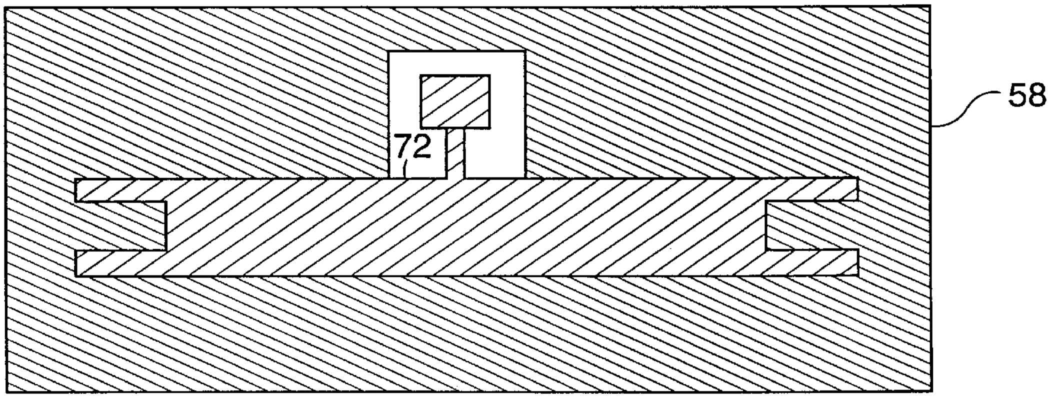
FIG. 27 is a top view of the device shown in FIG. 26.
Figure 28:
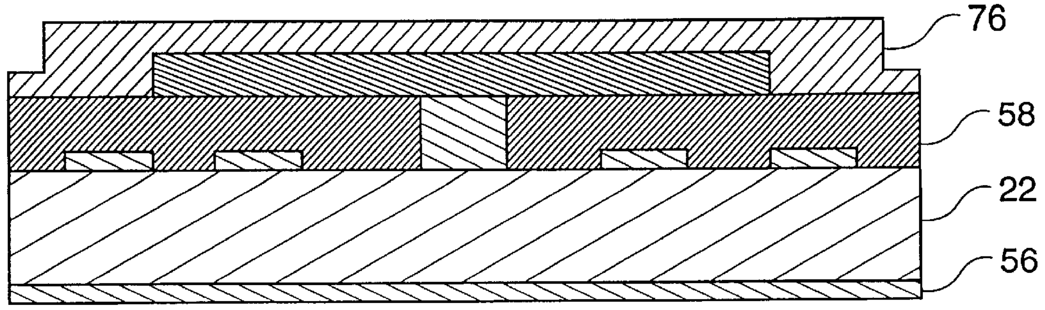
FIG. 28 is an elevational view of the device shown in FIG. 26 after the step of depositing a TiW-Au layer.
Figure 29:
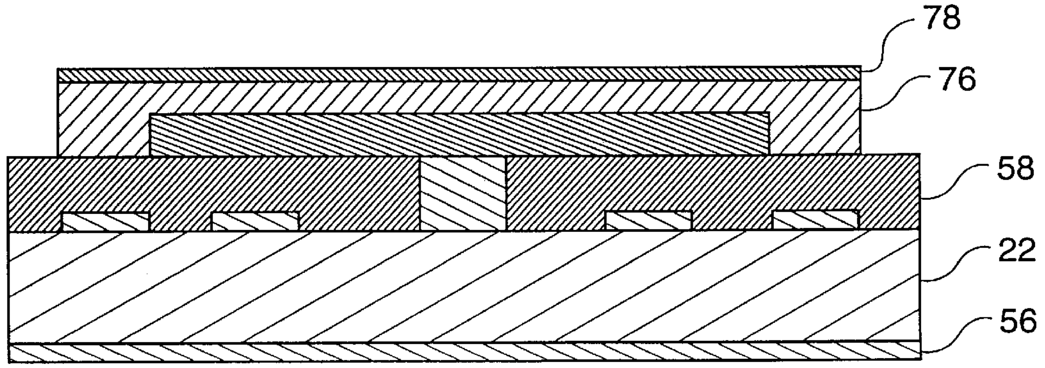
FIG. 29 is an elevational view of the device shown in FIG. 28 after the step of etching the TiW-Au layer to form the beam electrode and ground pad.
Figure 30:
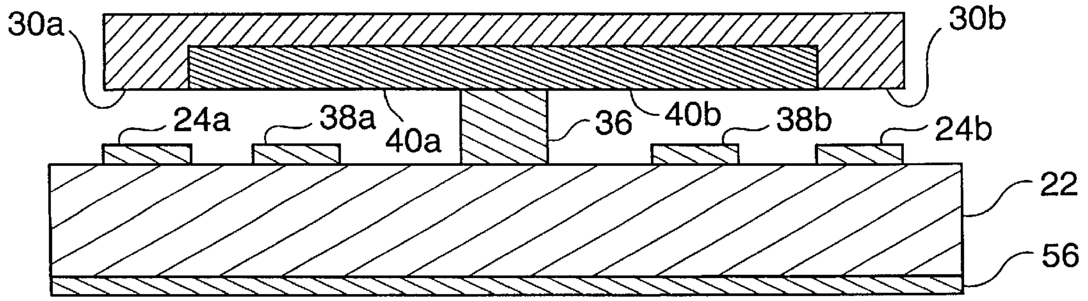
FIG. 30 is an elevational view of the device shown in FIG. 29 after the step of dissolving away the positive photoresist.

Using the TiW layer 74 as a mask, the TiW-$Si_3N_4$ layer 72 is etched to form the beam, as shown in FIGS. 26 and 27. The TiW mask 74 is then etched away, and another TiW-Au layer 76 is deposited, as shown in FIG. 28. Using a positive photoresist beam pattern 76, the TiW-Au layer 76 is then etched to form the beam and Au ground pad, as shown in FIG. 29. Finally, the beam is released by dissolving the photoresist 58 with acetone as described in conjunction with the first process. The final structure for the fourth alternative process is shown in FIG. 30, and is the same as FIG. 14 in a top view.

Figure 31:
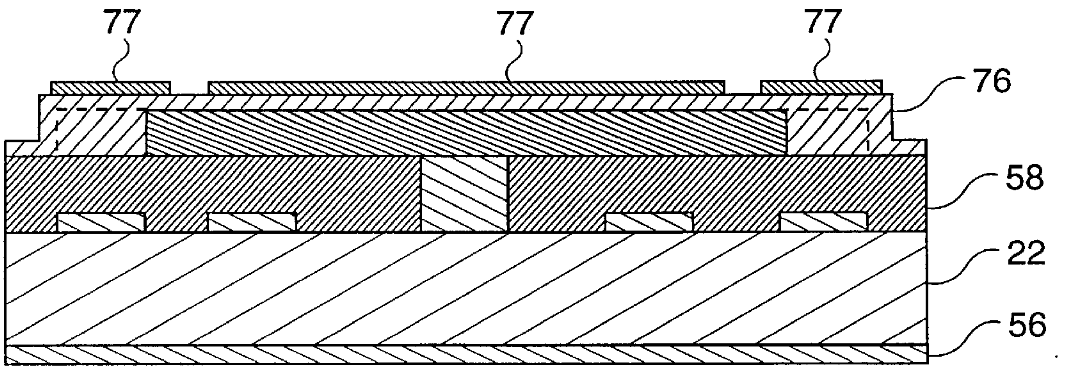
FIG. 31 is an elevational view of the device of the present invention after the step of depositing a TiW-Au and a TiW layer and etching the top TiW layer to form a mask, according to a fifth alternative process.
Figure 32:
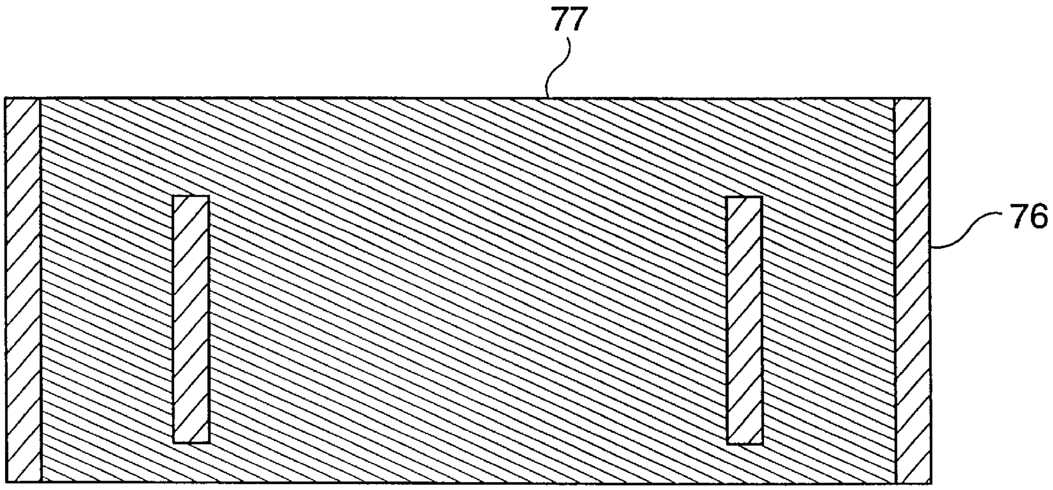
FIG. 32 is a top view of the device shown in FIG. 31.
Figure 33:
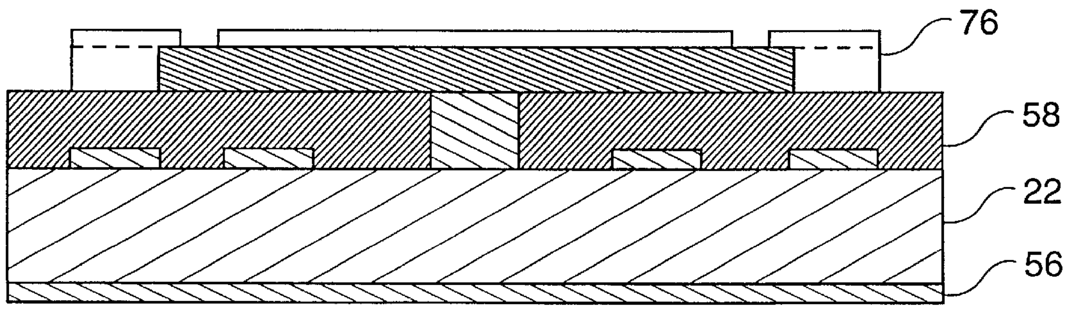
FIG. 33 is an elevational view of the device shown in FIG. 31 after the step of etching the TiW-Au layer and removing the TiW mask.
Figure 34:
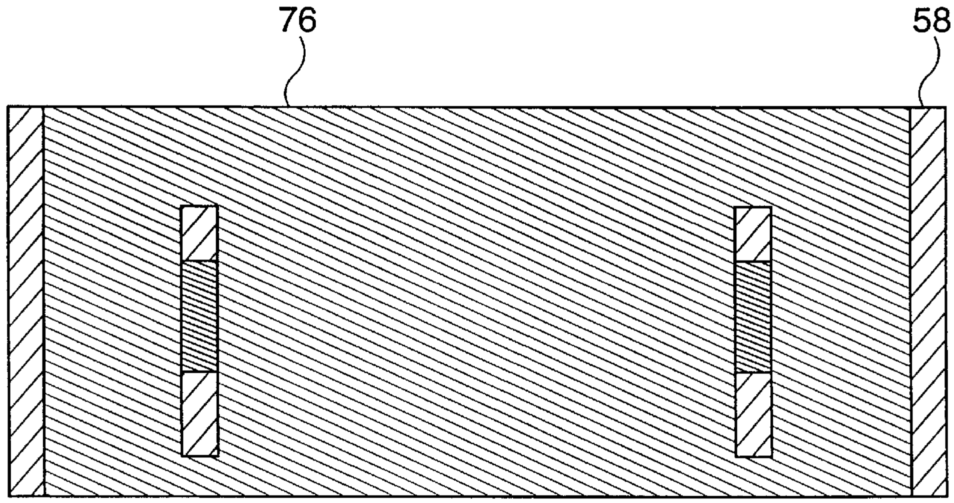
FIG. 34 is a top view of the device shown in FIG. 33.

Turning now to FIGS. 31–37, there are shown elevational and top views of the device of the present invention made in accordance with a fifth alternative process. In this process, the beam material is a thick dielectric with a thin Au layer embedded inside the beam to provide a means for voltage application. The initial steps performed are the same as those performed in the fourth alternative process up to the step of depositing the TiW-Au layer 76, as shown in FIG. 28. Next, a mask, such as a TiW layer 77, is deposited, holes are etched, and a photoresist layer is removed, as shown in FIGS. 31 and 32. This TiW layer 77 is used as a mask for subsequent etching of the TiW-Au layer 76 underneath, as shown in FIGS. 33 and 34. The TiW layer 77 is then etched away to allow the separation of the TiW-Au layer 76 into first and second contact pads 30*a* and 30*b*, and secondary control electrodes 40*a* and 40*b*.

Figure 35:
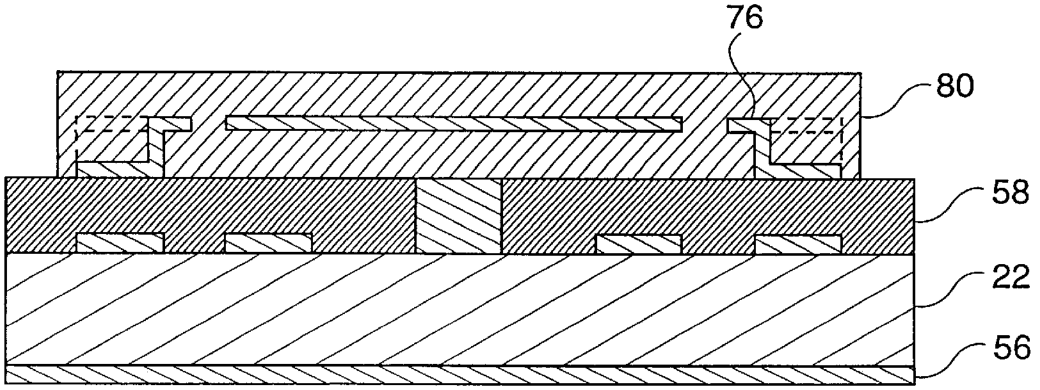
FIG. 35 is an elevational view of the device shown in FIG. 33 after the step of depositing a TiW-$Si_3N_4$ layer.
Figure 36:
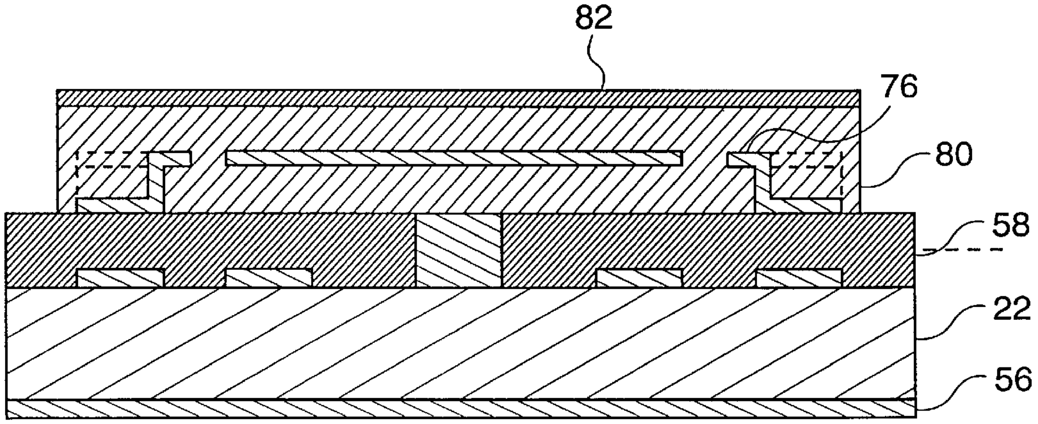
FIG. 36 is an elevational view of the device shown in FIG. 35 after the TiW-Au and TiW-$Si_3N_4$ layers have been etched to form the beam and ground.
Figure 37:
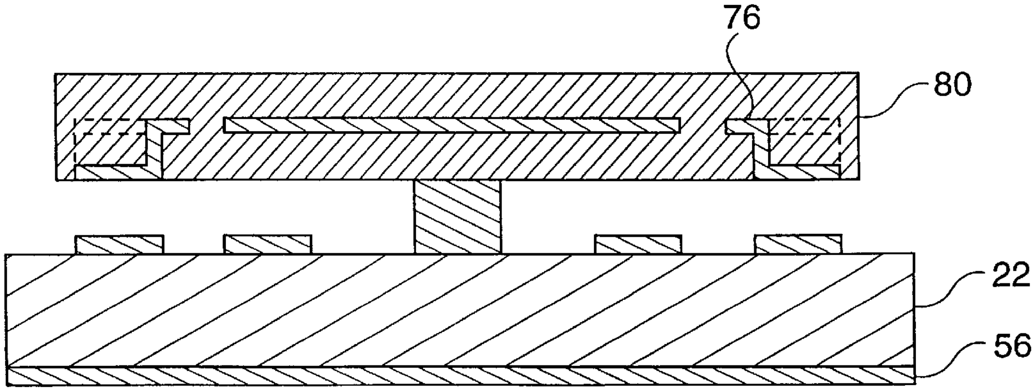
FIG. 37 is an elevational view of the device shown in FIG. 36 after the step of dissolving the photoresist in acetone.

At this point, a TiW-$Si_3N_4$ layer 80 is deposited, as shown in FIG. 35. A photoresist pattern 82 is developed, and the TiW-Au layer 76 and the TiW-$Si_3N_4$ layer 80 are etched to form the beam and ground pad, as shown in FIG. 36. As in the third alternative process, a photoresist pattern is developed to allow only the TiW-$Si_3N_4$ layer 80 on top of the Au ground pad to be etched away, as shown in FIG. 20. As in all previous processes, the beam is released by dissolving the photoresist 58 with acetone. The final structure for the fifth alternative process is shown in FIG. 37 and is the same as FIG. 22 in a top view. The device shown in FIG. 37 is similar to the device shown in FIG. 30, but is structurally stronger.

While the best modes for carrying out the invention have been described in detail, those familiar with the art to which this invention relates will recognize various alternative designs and embodiments for practicing the invention as defined by the following claims.

What is claimed is:

1. A microelectromechanical, MEM, device comprising:

a substrate having:

a first interconnection line;

a second interconnection line being parallel to the first interconnection line; and a first and second primary control electrode wherein the first primary control electrode is positioned on one side of the first interconnection line and wherein the second primary control electrode is positioned on the other side of the second interconnection line;

a flexible cantilever beam having a top surface and a bottom surface and a beam width and having:

a flexible anchor secured to the bottom surface of the beam at a center of the beam and attached to a center of the substrate so as to position the beam orthogonally to the first and second interconnection lines;

a first and second secondary control electrode secured to the bottom surface of the beam and positioned opposite the first and second primary control electrode said a first and second contact pad secured to the bottom surface of the beam and positioned opposite the first and second interconnection lines wherein said first contact pad and said first interconnection line define a first gap having a first gap width, and said second contact pad and said second interconnection line define a second gap having a second gap width, and wherein said flexible cantilever beam has a beam width larger than said first and second gap widths at a first and second portion corresponding to the first and second interconnection lines; and wherein when a voltage is applied to one of the first and second primary control electrodes and the corresponding one of the first and second secondary control electrodes the beam will move towards one of the first and second primary control electrodes causing one of the first and second contact pads to overlap the corresponding one of the first and second gaps so as to make an electrical connection between the corresponding one of the first and second interconnection lines.

2. The MEM device as recited in claim 1 wherein the first and second primary control electrodes are positive and the first and second secondary control electrodes are negative.

3. The MEM device as recited in claim 1 wherein the first and second primary control electrodes are negative and the first and second secondary control electrodes are positive.

4. The MEM device recited in claim 1 wherein first and second primary control electrodes are positioned between first and second interconnection lines.

5. The MEM device as recited in claim 1 wherein the first and second primary control electrodes are positioned outside the first and second interconnection lines.

6. The MEM device as recited in claim 1 wherein the flexible anchor is made of a metal material.

7. The MEM device as recited in claim 1 wherein the flexible anchor is made of a ceramic dielectric material.

8. The MEM device as recited in claim 1 wherein the flexible anchor is made of a polyamide material.

9. The MEM device as recited in claim 1 wherein the flexible anchor is a composite post having a first part and a second part, wherein the first part of the composite post has a first Young's modulus and the second part of the composite post has a second Young's modulus.

10. The MEM device as recited in claim 9 wherein the first Young's modulus is larger than the second Young's modulus.

11. The MEM device as, recited in claim 9 wherein the first Young's modulus is smaller than the second Young's modulus.

12. The MEM device as recited in claim 1 further comprising a dielectric layer positioned on a top surface of each of the first and second interconnection lines and the first and second contact pads so as to reduce the possibility of sticking upon application of the voltage.

13. The MEM device as recited in claim 1 wherein the top surface of the cantilever beam comprises a dielectric layer and the bottom surface comprises a conductive layer, the dielectric layer being thicker than the conductive layer.

14. The MEM device as recited in claim 1 wherein the top surface of the cantilever beam comprises a conductive layer, and a portion of the bottom surface comprises a dielectric layer, wherein the conductive layer forms the first and second contact pads and the dielectric layer forms the first and second secondary control electrodes.

15. The MEM device as recited in claim 1 wherein the cantilever beam comprises a dielectric layer having a conductive layer embedded therein, wherein the dielectric layer forms the first and second secondary control electrodes and the conductive layer forms first and second contact pads.

* * * * *